(12) United States Patent
Wang

(10) Patent No.: US 7,874,861 B2
(45) Date of Patent: Jan. 25, 2011

(54) PCB CONNECTOR

(75) Inventor: Yi-Kuo Wang, Taoyuan Hsien (TW)

(73) Assignee: Yihyung Technology Co., Ltd., Taoyuan Hsien (TW)

( * ) Notice: Subject to any disclaimer, the term of this patent is extended or adjusted under 35 U.S.C. 154(b) by 31 days.

(21) Appl. No.: 12/495,725

(22) Filed: Jun. 30, 2009

(65) Prior Publication Data

US 2010/0330833 A1 Dec. 30, 2010

(51) Int. Cl.
*H01R 13/62* (2006.01)
(52) U.S. Cl. .................................... 439/325
(58) Field of Classification Search ........... 439/325, 439/374, 629, 630, 632, 79, 345; 29/840, 29/846, 832; 361/801, 813; 174/255; 248/309.1; 40/48; 228/49.1
See application file for complete search history.

(56) References Cited

U.S. PATENT DOCUMENTS

| 4,520,428 | A | * | 5/1985 | Lusk ........................... 361/759 |
|---|---|---|---|---|
| 4,804,130 | A | * | 2/1989 | Kwan et al. ................... 228/6.2 |
| 5,085,362 | A | * | 2/1992 | Art et al. ..................... 228/49.1 |
| 5,216,411 | A | * | 6/1993 | Ashitomi et al. ............. 345/168 |
| 5,854,741 | A | * | 12/1998 | Shim et al. ................... 361/813 |
| 5,866,852 | A | * | 2/1999 | Benz et al. ................... 174/255 |
| 6,574,862 | B1 | * | 6/2003 | Choi et al. ...................... 29/846 |
| 6,813,853 | B1 | * | 11/2004 | Tucker ......................... 40/448 |
| 2007/0087630 | A1 | * | 4/2007 | Ku .............................. 439/607 |
| 2009/0250580 | A1 | * | 10/2009 | Strizki ...................... 248/309.1 |

* cited by examiner

*Primary Examiner*—Alexander Gilman

(57) ABSTRACT

For connecting multiple PC boards to form a PCB pane, a PCB connector is disclosed include a bearing strip, which has locating grooves spaced along the length, upright pins disposed in the locating grooves and inserted through respective through holes on connection portions of the PC boards to be connected and studs spaced along the length and disposed beyond the locating grooves, and a holding down strip, which has locating grooves corresponding to the locating grooves of the bearing strip for receiving the connection strips of the PC boards, pin holes respectively press-fitted onto the upright pins and sockets respectively fastened to the studs of the bearing strip.

5 Claims, 5 Drawing Sheets

PCB CONNECTOR

BACKGROUND OF THE INVENTION

1. Field of the Invention

The present invention relates to PC board technology and more specifically, to a PCB connector adapted for connecting multiple PC boards to form a PCB panel.

2. Description of the Related Art

Multiple PC boards may be arranged on a substrate to form a PCB panel. When a PCB panel is found defective during a processing process, the whole PCB panel may be thrown away.

FIG. 5 illustrates a PCB plate member A' having multiple PC board units A'1 and material strips A'2 joining the PC board units A'1. The whole PCB plate member A' is convenient for processing the PC board units A'1 efficiently. After processing, the PC board units A'1 are cut from the material strips A'2, and the material strips A'2 become waste. Further, to avoid damaging the PC board units A'1 when cutting off the PC board units A'1 from the material strips A'2, the border of each PC board unit A'1 is precut to have only a small part of each PC board unit A'1 be kept in connection to the material strips A'2. After the processing work is finished, the PC board units A'1 can be cut off from the material strips A'2 easily. According to this method, much waste material is left. Further, if one or two PC board units A'1 are defective during processing of the PCB plate member A', the whole PCB plate member A' will be thrown away. Therefore, manufacturers generally prepare extra spare PCB plate members A' for use to substitute for detective ones. Preparing a number of extra spare PCB plate members A' relatively increases the cost.

Therefore, it is desirable to provide means that eliminates the aforesaid problems.

SUMMARY OF THE INVENTION

The present invention has been accomplished under the circumstances in view. It is one object of the present invention to provide a PCB connector, which is re-usable and practical for connecting multiple PC boards to form a PCB panel for processing.

It is another object of the present invention to provide a PCB connector for connecting multiple PC boards to form a PCB panel for processing, which allows quick replacement of the connected PC boards individually.

It is another object of the present invention to provide a PCB connector, which is practical for connecting multiple pre-machined PC boards to form a PCB panel for processing, avoiding waste of PCB material and saving much the manufacturing cost.

To achieve these and other objects of the present invention, a PC board connector for connecting multiple PC boards to form a PCB panel, comprising a bearing strip and a holding down strip. The bearing strip has a plurality of locating grooves located on a first side thereof and spaced along the length thereof. The holding down strip is attachable to the first side of the bearing strip to hold down connection portions of PC boards in the locating grooves of the bearing strip. The holding down strip has a plurality of locating grooves corresponding to the locating grooves of the bearing strip for receiving the connection portions of the PC boards. Each locating groove of the holding down strip defines with the corresponding locating groove of the bearing strip a positioning space for receiving one connection portion of one PC board to be connected.

DETAILED DESCRIPTION OF THE PREFERRED EMBODIMENT

Figure 1:
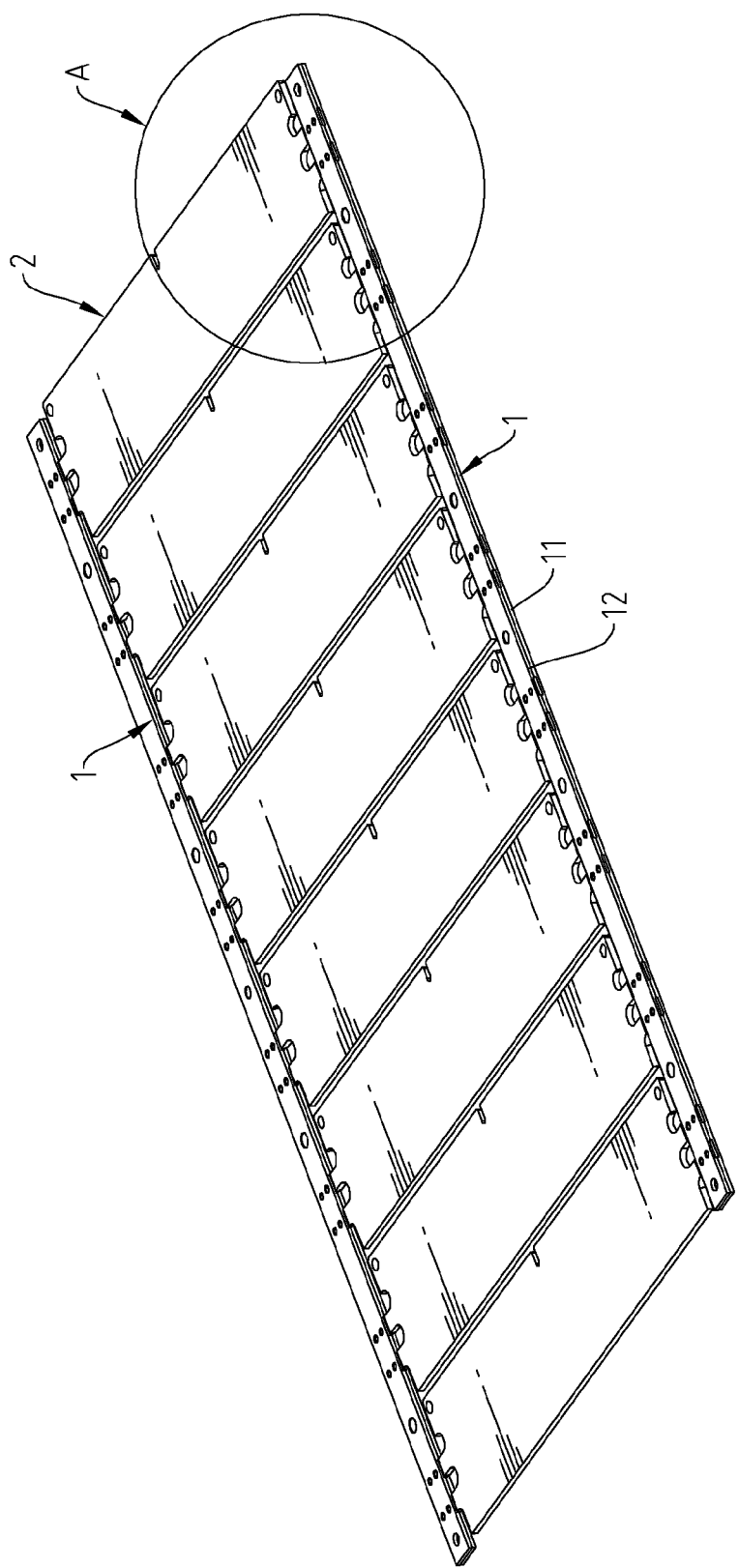
FIG. 1 is an elevational view of PCB panel formed of two PCB connectors and multiple printed circuit boards according to the present invention.
Figure 2:
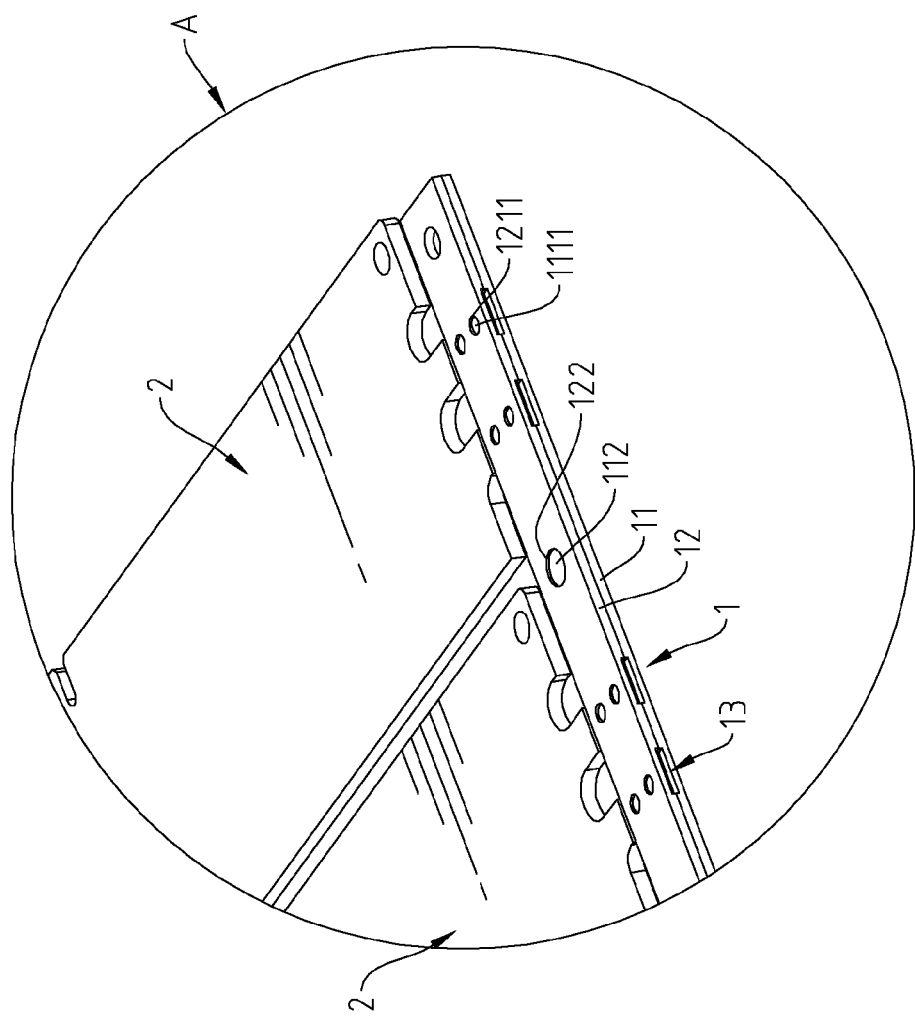
FIG. 2 is an enlarged view of part A of FIG. 1.
Figure 3:
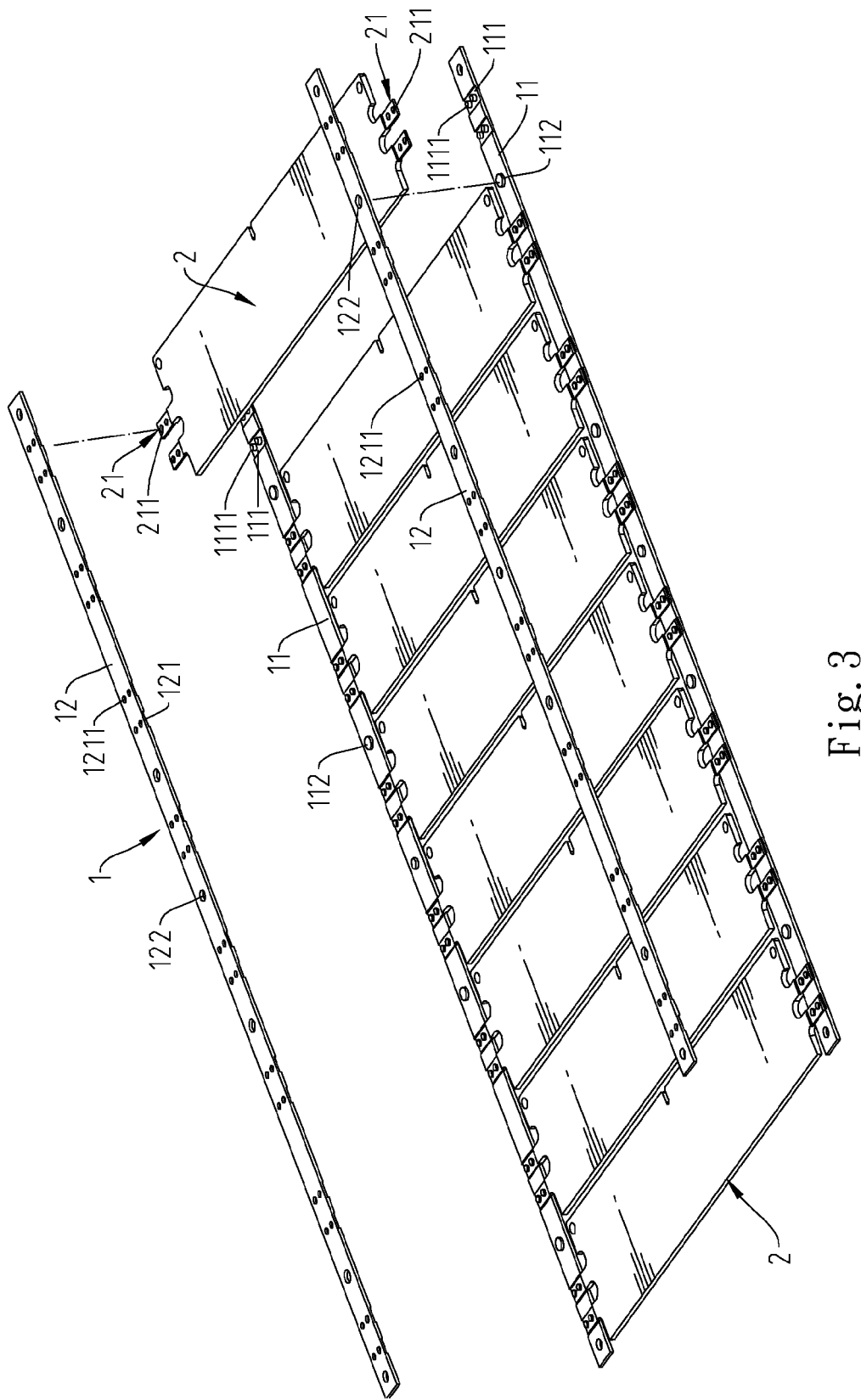
FIG. 3 is an exploded view of the PCB panel shown in FIG. 1.
Figure 4:
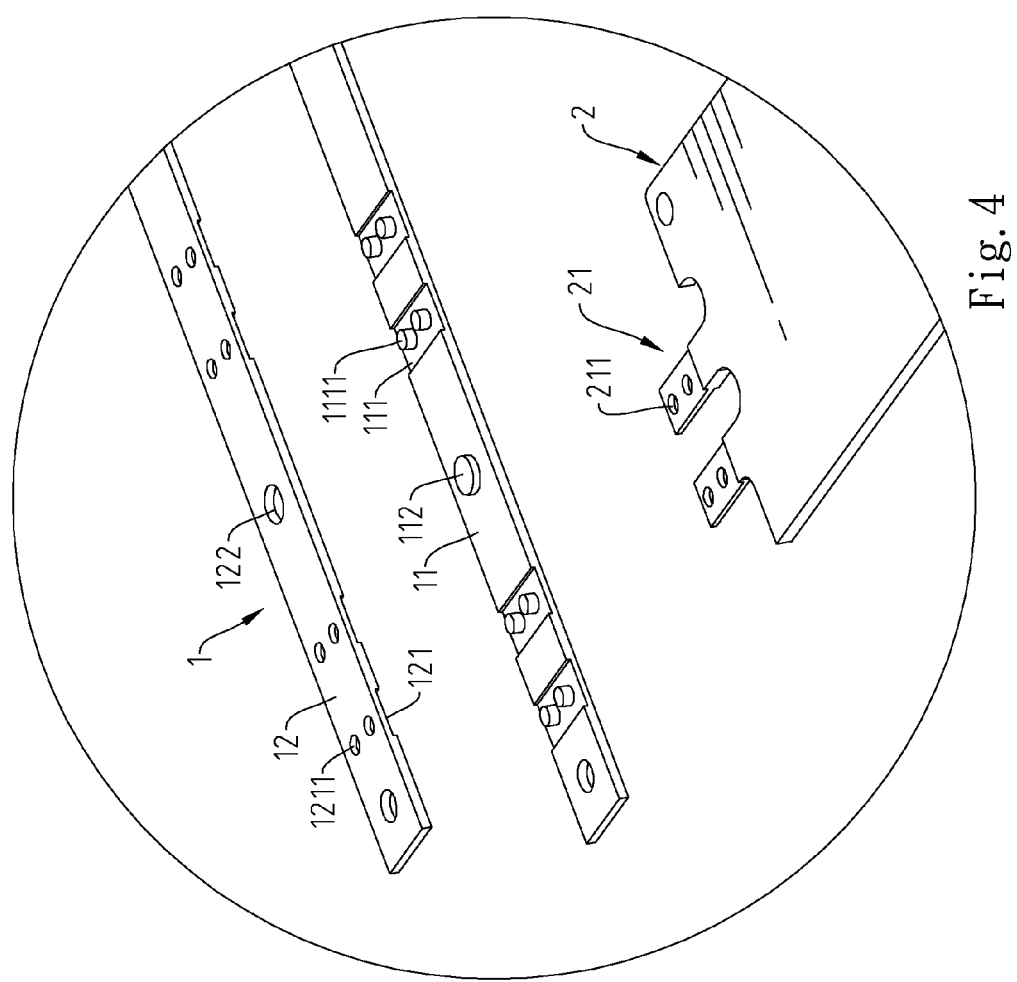
FIG. 4 is an exploded view in an enlarged scale of a part of the PCB panel.

Referring to FIGS. 1-4, a PCB connector for joining multiple printed circuit boards into a PCB panel is show comprising a bearing strip 11 and a holding down strip 12.

The bearing strip 11 has a plurality of first locating grooves 111 transversely extending on one side, namely, the top side and spaced along the length, a plurality of studs 112 respectively perpendicularly extended from the top side and spaced along the length, and a plurality of pins 1111 respectively perpendicularly extended from the bottom walls of the first locating grooves 111.

The holding down strip 12 fits the bearing strip 11 in configuration, having a plurality of second locating grooves 121 transversely extending on one side, namely, the bottom side corresponding to the first locating grooves 111 of the bearing strip 11, a plurality of sockets 122 spaced along the length corresponding to the studs 112 of the bearing strip 11, and a plurality of pin holes 1211 respectively formed in the second locating grooves 121 for receiving the pins 1111 of the bearing strip 11.

Further, each PC board 2 to be joined by the PCB connector has a plurality of connection portions 21 respective protruded from two distal ends thereof, and a plurality of through holes 211 cut through the top and bottom sides of the connection portions 21. The connection portions 21 of each PC board 2 are formed of the substrate of the respective PC board by means of a milling technique.

When the bearing strip 11 and the holding down strip 12 are attached together, each first locating groove 111 and the corresponding second locating groove 121 define a positioning space 13 that has a height approximately equal to the thickness of connection portions 21 of PC boards 2 to be joined.

When joining multiple PC boards 2 to form a PCB panel, arrange the bearing strips 11 of two PCB connectors 1 in parallel, and then attach the connection portions 21 at two ends of each of PC boards 2 to the first locating grooves 111 of the bearing strips 11 to have the pins 1111 of the bearing strips 11 be inserted through the through holes 211 of the connection portions 21, and then attach the holding down strips 12 of the two PCB connectors 1 to the bearing strips 11 to force the pin holes 1211 and sockets 122 of the holding down strips 12 into engagement with the respective pins 1111 and studs 112 of the bearing strips 11 respectively. At this time, the connection portions 21 of the PC boards 2 are positioned in the respective positioning space 13 and secured to the pins 1111 of the PCB connectors 1 firmly. Thus, the PC boards 2 are interconnected between the PCB connectors 1, forming a PCB panel.

Further, when one PC board 2 of the PCB panel is damaged or unable to function well during a processing step to process the PCB panel, detach the holding down strips 12 from the PC boards 2 and the bearing strips 11, and then detach the damaged PC board 2 from the bearing strips 11 for a replacement. After a new PC board 2 has been attached to the bearing strips 11 to replace the damaged PC board, the holding down strips 12 are fastened to the bearing strips 11 to hold down the PC boards 2 for receiving a processing process continuously. Because every PC board can be replaced individually, it is not necessary to replace the whole PCB panel when one PC board is damaged, saving much the cost.

Further, because the PC boards 2 are pre-machined and then connected to the PCB connectors 1 to form a PCB panel, the PC boards 2 are directly cut into shape for connection, avoiding waste of material as seen in the prior art design.

Figure 5:
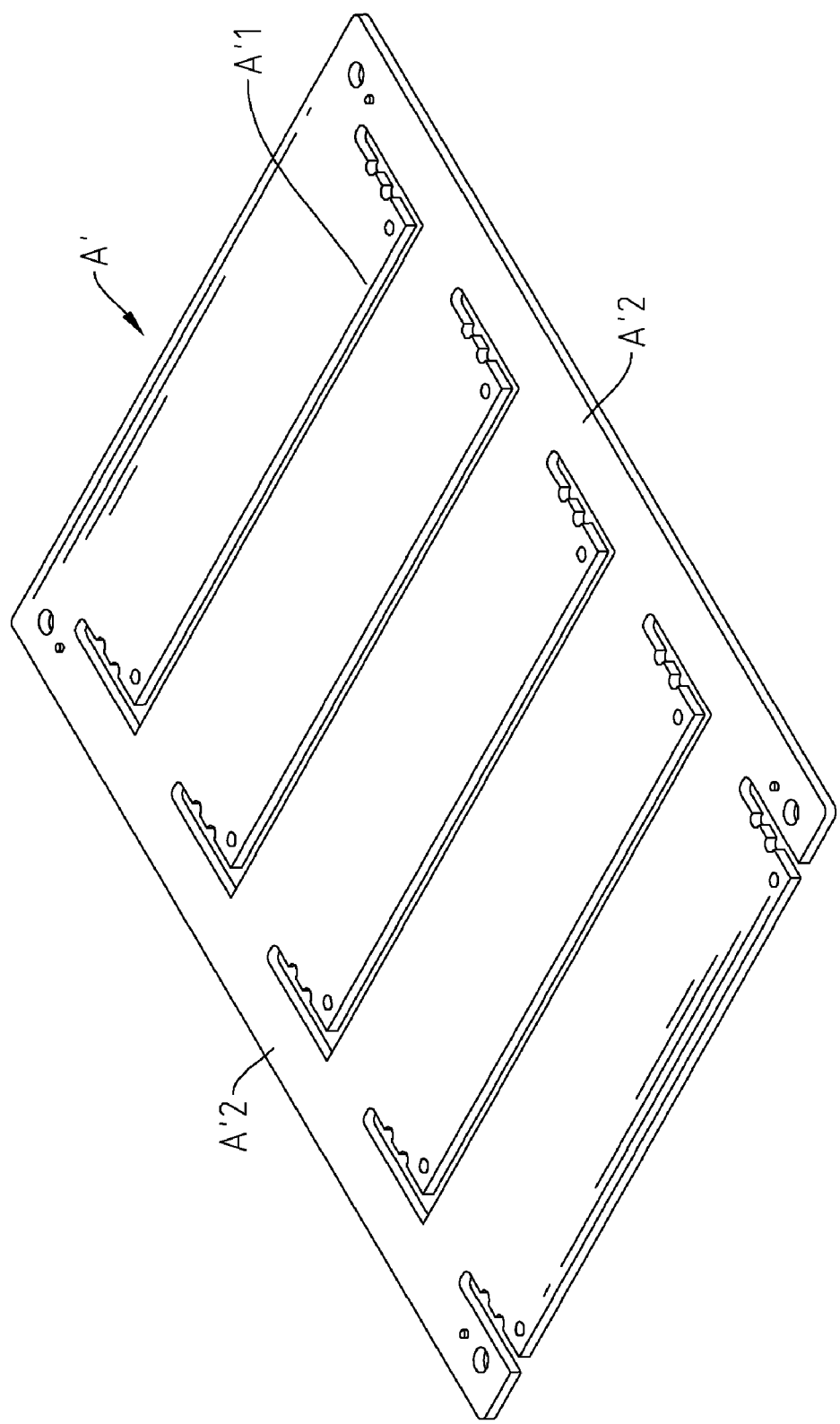
FIG. 5 is a PCB panel of interconnected PC boards according to the prior art.

A prototype of PCB connector has been constructed with the features of FIGS. 1-5. The PCB connector functions smoothly to provide all of the features disclosed earlier.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A PCB connector for connecting multiple PC boards to form a PCB panel, the PCB connector comprising:
    a bearing strip, said bearing strip having a plurality of locating grooves located on a first side thereof and spaced along the length thereof; and
    a holding down strip attachable to the first side of said bearing strip to hold down connection portions of PC boards in the locating grooves of said bearing strip, said holding down strip having a plurality of locating grooves corresponding to the locating grooves of said bearing strip for receiving the connection portions of the PC boards, each locating groove of said holding down strip defining with the corresponding locating groove of said bearing strip a positioning space for receiving one connection portion of one PC board to be connected.

2. The PCB connector as claimed in claim 1, wherein said bearing strip has a plurality of upright pins respectively disposed in the locating grooves thereof for insertion through respective through holes on the connection portions of the PC boards; said holding down strip has a plurality of pin holes respectively press-fitted onto the pins of said bearing strips.

3. The PCB connector as claimed in claim 1, wherein said bearing strip has a plurality studs perpendicularly extended from the first side thereof and spaced along the length; said holding down strips has a plurality of sockets respectively forced into engagement with said pins.

4. The PCB connector as claimed in claim 1, wherein said positioning space has a height equal to the thickness of the connection portions of the PC boards to be connected.

5. The PCB connector as claimed in claim 1, wherein said bearing strip and said holding down strip are kept in flush with top and bottom sides of the PC boards connected thereto.

* * * * *